(12) United States Patent
Huang et al.

(10) Patent No.: US 11,799,011 B2
(45) Date of Patent: Oct. 24, 2023

(54) SEMICONDUCTOR EPITAXIAL WAFER

(71) Applicant: VISUAL PHOTONICS EPITAXY CO., LTD., Taoyuan (TW)

(72) Inventors: Chao-Hsing Huang, Taoyuan (TW); Yu-Chung Chin, Taoyuan (TW); Van-Truong Dai, Taoyuan (TW)

(73) Assignee: VISUAL PHOTONICS EPITAXY CO., LTD., Taoyuan (TW)

( * ) Notice: Subject to any disclaimer, the term of this patent is extended or adjusted under 35 U.S.C. 154(b) by 8 days.

(21) Appl. No.: 17/715,140

(22) Filed: Apr. 7, 2022

(65) Prior Publication Data

US 2022/0328645 A1    Oct. 13, 2022

(30) Foreign Application Priority Data

Apr. 7, 2021 (TW) .................................. 110112578

(51) Int. Cl.
| | | |
|---|---|---|
| *H01L 29/45* | (2006.01) | |
| *H01L 29/737* | (2006.01) | |
| *H01L 31/103* | (2006.01) | |
| *H01S 5/042* | (2006.01) | |
| *H01S 5/02* | (2006.01) | |
| *H01L 27/144* | (2006.01) | |
| *H01S 5/183* | (2006.01) | |

(52) U.S. Cl.
CPC ........ *H01L 29/452* (2013.01); *H01L 27/1443* (2013.01); *H01L 29/7371* (2013.01); *H01L 31/1035* (2013.01); *H01S 5/0206* (2013.01); *H01S 5/04256* (2019.08); *H01S 5/183* (2013.01)

(58) Field of Classification Search
CPC ............... H01L 29/452; H01L 27/1443; H01L 29/7371; H01L 31/1035; H01L 29/0817; H01L 29/205; H01L 29/66318; H01L 25/04; H01L 27/06; H01L 29/201
See application file for complete search history.

(56) References Cited

U.S. PATENT DOCUMENTS 7,385,236 B2 *  6/2008  Chin ................... H01L 27/0605
                                                      257/E29.189

* cited by examiner

Primary Examiner — Syed I Gheyas
(74) Attorney, Agent, or Firm — AMIN, TUROCY & WATSON, LLP

(57) ABSTRACT

Provided is a semiconductor epitaxial wafer, including a substrate, a first epitaxial structure, a first ohmic contact layer and a second epitaxial stack structure. It is characterized in that the ohmic contact layer includes a compound with low nitrogen content, and the ohmic contact layer does not induce significant stress during the crystal growth process. Accordingly, the second epitaxial stack structure formed on the ohmic contact layer can have good epitaxial quality, thereby providing a high-quality semiconductor epitaxial wafer for fabricating a GaAs integrated circuit or a InP integrated circuit. At the same time, the ohmic contact properties of ohmic contact layers are not affected, and the reactants generated during each dry etching process are reduced.

11 Claims, 12 Drawing Sheets

SEMICONDUCTOR EPITAXIAL WAFER

CROSS-REFERENCE TO RELATED APPLICATION

This application claims priority to Taiwanese Application Serial No. 110112578, filed on Apr. 7, 2021. The entirety of the above-mentioned patent application is hereby incorporated by reference herein and made a part of this specification.

TECHNICAL FIELD

The technical field relates to a semiconductor epitaxial wafer, especially a semiconductor epitaxial wafer for manufacturing a GaAs integrated circuit or an InP integrated circuit without using a GaN material system. An ohmic contact layer between two semiconductor devices has low nitrogen content and does not generate significant stress with respect to a substrate. The two semiconductor devices are in a vertically stacked relative relationship.

BACKGROUND

In the field of semiconductors, whether for the study of semiconductor physics and material properties or for the fabrication of semiconductor devices, the contact between metal and semiconductor plays an extremely important role. The quality of contact performance directly affects the quality of semiconductor devices. Metal-semiconductor contacts are generally divided into two categories: one is a Schottky contact with a rectifying effect; the other is an ohmic contact with a non-rectifying effect. Semiconductor devices are usually electrically connected by ohmic contacts. The quality of the ohmic contact, the size of the contact resistance and the heat dissipation will affect the main characteristics of semiconductor devices such as efficiency, RF characteristics, optoelectronic characteristics, noise, gain or switching speed. Generally speaking, the ohmic contact resistance between metal and a semiconductor layer is as small as possible. This requires a good ohmic contact. That is, the better the ohmic contact performance is, the lower the ohmic contact resistance will be.

Referring to FIG. 1, FIG. 1 is a schematic diagram showing a prior art heterojunction bipolar transistor (HBT). Indium gallium arsenide (InGaAs) is generally used in the ohmic contact layer for the emitter. Additionally, in US Patent Publication No. 2003/0025128 A1, it is disclosed that InGaAs is used in the ohmic contact layer of the emitter. Hence, in the prior art, the resistance of the ohmic contact layer for the emitter is lowered through the material containing indium.

Generally, the InGaAs or InGaAsSb ohmic contact layer is formed on GaAs or AlGaAs. Take the InGaAs ohmic contact layer and GaAs as an example. Since the lattice constant of InGaAs is greater that of GaAs, InGaAs will generate compressive stress during the epitaxial growth of InGaAs. When the thickness of the InGaAs layer exceeds its critical thickness, defects or dislocations are likely to be generated in the InGaAs layer. Therefore, when a multi-layer epitaxial layer is formed on the defective or dislocated InGaAs ohmic contact layer, the multi-layer epitaxial layer on the InGaAs ohmic contact layer is also prone to defects, dislocation or surface morphology. As a result, the quality of the epitaxial layer on the InGaAs ohmic contact layer is poor. Due to this limitation, it is difficult to fabricate another semiconductor device with good quality on the InGaAs layer or the InGaAsSb ohmic contact layer. Besides, it is also difficult to realize high integration or high quality GaAs integrated circuits.

Generally, in order to form a good ohmic contact, the ohmic contact layer requires a material with a smaller bandgap. For InGaAs and InGaAsSb, the bandgap between InGaAs and InGaAsSb can be reduced by increasing indium (In) content. However, when the In content is increased, more reactants are generated due to the increase of In during the dry etching process. Therefore, the reactants remaining in the chamber and exhaust system need to be frequently removed, thereby directly affecting the throughput, yield or increasing costs.

In addition, when the substrate and the ohmic contact are GaAs and InGaAs(Sb), respectively, there will be a large lattice mismatch between the GaAs substrate and the InGaAs(Sb) ohmic contact layer, resulting in significant stress on the InGaAs(Sb) ohmic contact layer. As such, the InGaAs(Sb) ohmic contact layer is easy to have defects, dislocation or poor surface morphology. When the ohmic contact layer is GaAs and the substrate is GaAs, although the lattice constant of the GaAs ohmic contact layer is the same as that of the substrate, the bandgap of the GaAs ohmic contact layer is too large, resulting in poor ohmic contact properties. Although the bandgap of the InGaAs(Sb) ohmic contact layer can be reduced by increasing the In content, it has the disadvantages mentioned above.

SUMMARY

The purpose of the present disclosure is to solve the shortcomings and limitations of the prior art, and to provide a GaAs integrated circuit or an InP integrated circuit with good epitaxial quality. At the same time, the ohmic contact properties of ohmic contact layers are not affected, and the reactants generated during each dry etching process are reduced.

In one embodiment, a semiconductor epitaxial wafer includes a substrate, a first epitaxial stack structure, an ohmic contact layer and a second epitaxial stack structure. It is characterized in that the ohmic contact layer is made of compounds with low nitrogen content, and the lattice mismatch between the ohmic contact layer and the substrate is controlled such that the ohmic contact layer does not have obvious stress relative to the GaAs substrate during the epitaxial growth process and such that the ohmic contact layer has fewer defects and dislocations or better surface morphology. As such, the second epitaxial stack structure with sufficient layers and good epitaxial quality can be formed on the ohmic contact layer. Additionally, it is worth mentioning that although the ohmic contact layer is made of compounds with low nitrogen content, it does not significantly increase the contact resistance of the ohmic contact layer.

In one embodiment, the ohmic contact layer with low nitrogen content is further disposed between the substrate and the first epitaxial stack structure or in the first epitaxial stack structure.

In one embodiment, the low nitrogen content of the "ohmic contact layer" has a material that may be GaAsN, GaAsNSb, GaAsNBi, GaAsNSbBi, InGaAsN, InGaAsNSb, InGaAsNBi or InGaAsNSbBi.

A semiconductor epitaxial wafer for making a GaAs integrated circuit or an InP integrated circuit with good epitaxial quality is provided in the present disclosure. The so-called GaAs integrated circuit or InP integrated circuit means that a GaAs substrate, a Ge substrate or an InP substrate is used as the substrate. A GaAs-based material or a InP-based material is used for the first and second epitaxial stack structures according to the type of the substrate. It is worth noting that a GaN-based material is not used for the first epitaxial stack structure and the second epitaxial stack structure.

In one embodiment, the first epitaxial stack structure further includes a semiconductor layer which is in direct or indirect contact with the ohmic contact layer. When the epitaxial wafer is used to make a GaAs integrated circuit, the substrate may be a Ge substrate or a GaAs substrate, and the semiconductor layer may be GaAs, AlGaAs, InAlAs, InGaP or InGaAs. Accordingly, a GaAs-based material is used for the first and second epitaxial stack structures. When the epitaxial wafer is used to make an InP integrated circuit, the substrate may be an InP substrate, and the semiconductor layer may be InAlAs, InGaP, InP, InAlGaAs and InGaAsP. Consequently, an InP-based material is used for the first and second epitaxial stack structures. The GaAs integrated circuit or the InP integrated circuit herein refers to an epitaxial wafer having a plurality of semiconductor devices in a vertical stacking relationship (a relative relationship).

Compared with the prior art, since the ohmic contact layer is made of low nitrogen-containing materials such as GaAsN, InGaAsN, a carrier barrier between the "N-type ohmic contact layer" and the "N-type ohmic contact metal" will be reduced (as compared to the prior art InGaAs ohmic contact layer). Therefore, the ohmic contact characteristics of the "N-type ohmic contact layer" and the "n-type ohmic contact metal" may be better. Similarly, compared with the prior art, the ohmic contact layer may be an (In)GaAsNSb, (In)GaAsNBi or (In)GaAsNSbBi ohmic contact layer. Since the ohmic contact layer contains Sb or Bi, a carrier barrier between the "P-type ohmic contact layer" and the "P-type ohmic contact metal" will be increased (as compared to the prior art InGaAs ohmic contact layer). Consequently, the ohmic contact characteristics of the "P-type ohmic contact layer" and the "P-type ohmic contact metal" may be better.

In one aspect, since InGaAsN, InGaAsNSb, InGaAsNBi or InGaAsNSbBi has a bandgap that is smaller than that of InGaAs (InGaAsSb), the In content in InGaAsN, InGaAsNSb, InGaAsNBi or InGaAsNSbBi can be reduced. As such, during each dry etching process, the generated reactants become less, thereby prolonging the cycle of cleaning and maintenance of equipment and reducing the frequency of cleaning and maintenance of equipment, which are beneficial to increase the productivity, yield or reduce costs.

Preferably, the lattice mismatch of "ohmic contact layer and Ge," "ohmic contact layer and GaAs" or "ohmic contact layer and InP" should be less than about ±10000 ppm. By making the lattice constant of the ohmic contact layer close to that of the substrate, when the ohmic contact layer is grown, the ohmic contact layer will not have significant stress such that the critical thickness of the ohmic contact layer can be thicker. In other words, the ohmic contact layer is less prone to defects, dislocations or surface morphology deterioration. Consequently, one or more epitaxial layers with good quality are easily grown on the ohmic contact layer.

In one embodiment, a "bandgap graded layer" is further arranged between the ohmic contact layer and its adjacent semiconductor layer, and the "bandgap graded layer" can help electrons to cross a higher electron barrier.

The "ohmic contact layer" using GaAsN, GaAsNSb, GaAsNBi, GaAsNSbBi, InGaAsN, InGaAsNSb, InGaAsNBi or InGaAsNSbBi can form an ohmic contact with most metallic materials used for the ohmic contact. In addition, the material of the low nitrogen-containing ohmic contact layer has a smaller bandgap, and can also achieve a better ohmic contact.

In one embodiment, a semiconductor epitaxial wafer includes a substrate, a first epitaxial stack structure and an ohmic contact layer with low nitrogen content. The ohmic contact layer with low nitrogen content is disposed between the substrate and the first epitaxial stack structure, in the first epitaxial stack structure or including both. The embodiment of the ohmic contact layer is the same as the aforesaid ohmic contact layer.

The first epitaxial stack structure and the second epitaxial stack structure can form a first semiconductor device and the second semiconductor device. According to different application purposes, the first semiconductor device and the second semiconductor device may be the same or different semiconductor devices. The first semiconductor device or the second semiconductor device may be a field effect transistor (FET), a heterojunction bipolar transistor (HBT), a high electron mobility transistor (HEMT), a pseudomorphic high electron mobility transistor (PHEMT), a bipolar junction transistor (BJT), a bipolar field effect transistor (BiFET), a bipolar high electron mobility transistor (Bi-HEMT), a photodiode (PD), a laser diode (LD), an edge emitting laser (EEL), a vertical cavity surface emitting laser (VCSEL), a varactor, a npn resistor/a pnp resistor, a light emitting diode (LED), a solar cell (SC).

DESCRIPTION OF THE EMBODIMENTS

Figure 1:
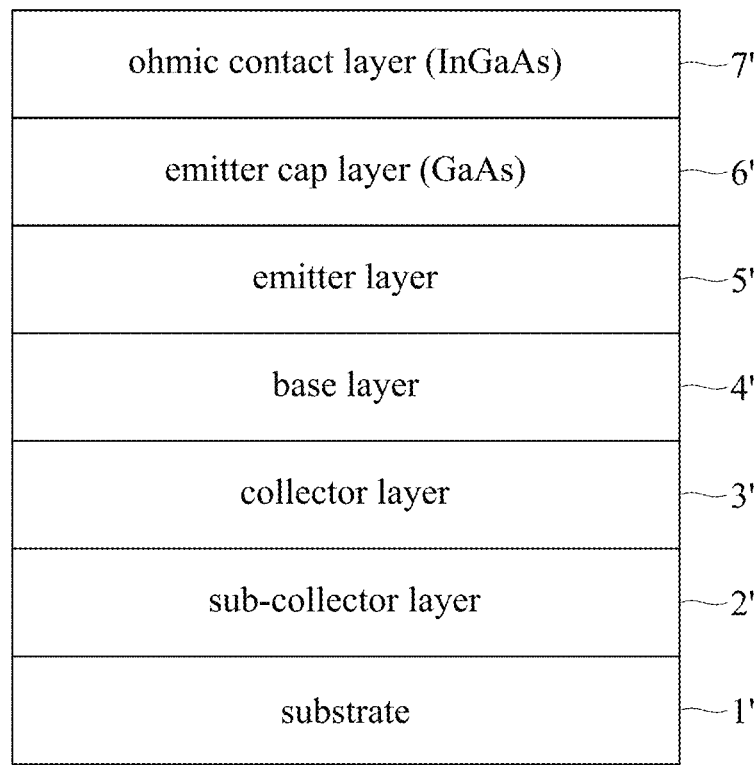
FIG. 1 is a schematic diagram showing a prior art heterojunction bipolar transistor (HBT), wherein the ohmic contact layer and the emitter cap layer are InGaAs and GaAs, respectively.

The embodiment of the present disclosure is described in detail below with reference to the drawings and element symbols, such that persons skilled in the art is able to implement the present application after understanding the specification of the present disclosure.

Specific examples of components and arrangements are described below to simplify the present disclosure. These are, of course, merely examples and they are not intended to limit the scope of the present disclosure. In the present disclosure, for example, when a layer formed above or on another layer, it may include an exemplary embodiment in which the layer is in direct contact with the another layer, or it may include an exemplary embodiment in which other devices or epitaxial layers are formed between thereof, such that the layer is not in direct contact with the another layer. In addition, repeated reference numerals and/or notations may be used in different embodiments, these repetitions are only used to describe some embodiments simply and clearly, and do not represent a specific relationship between the different embodiments and/or structures discussed.

Further, spatially relative terms, such as "underlying," "below," "lower," "overlying," "above," "upper" and the like, may be used herein for ease of description to describe one device or feature's relationship to another device(s) or feature(s) as illustrated in the figures and/or drawings. The spatially relative terms are intended to encompass different orientations of the device in use or operation in addition to the orientation depicted in the figures and/or drawings.

Moreover, certain terminology has been used to describe embodiments of the present disclosure. For example, the terms "one embodiment," "an embodiment," and "some embodiments" mean that a particular feature, structure or characteristic described in connection with the embodiment is included in at least one embodiment of the present disclosure. Therefore, it is emphasized and should be appreciated that two or more references to "an embodiment" or "one embodiment" or "an alternative embodiment" in various portions of the present disclosure are not necessarily all referring to the same embodiment.

Furthermore, the particular features, structures or characteristics may be combined in any suitable manner in one or more embodiments of the present disclosure. Further, for the terms "including", "having", "with", "wherein" or the foregoing transformations used herein, these terms are similar to the term "comprising" to include corresponding features.

In addition, a "layer" may be a single layer or a plurality of layers; and "a portion" of an epitaxial layer may be one layer of the epitaxial layer or a plurality of adjacent layers.

Figure 2:
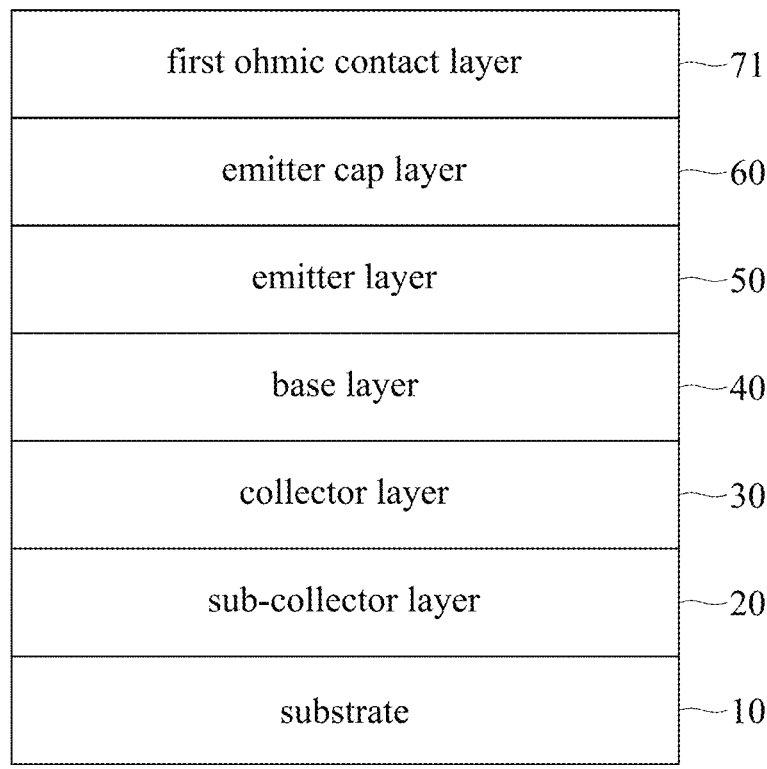
FIG. 2 is a schematic diagram showing a HBT according to a first embodiment of the present disclosure, wherein the ohmic contact layer is located on top of the HBT.

FIG. 2 is a schematic diagram showing a Heterojunction Bipolar Transistor (HBT) according to a first embodiment of the present disclosure.

As shown in FIG. 2, the first embodiment is an exemplary structure of the HBT. Referring to FIG. 2, a semiconductor device is illustrated by taking the HBT as an example. According to the first embodiment, the HBT includes a substrate 10, a sub-collector layer 20, a collector layer 30, a base layer 40, an emitter layer 50, an emitter cap layer 60 and a first ohmic contact layer 71. As shown in FIG. 2, the first ohmic contact layer 71 is formed on the emitter cap layer 60, and a metal (emitter) electrode (not shown) is formed on the first ohmic contact layer 71.

In some embodiments, the emitter layer 50 is the top layer of the HBT, and the first ohmic contact layer 71 is in ohmic contact on the emitter layer 50. The arrangement position and arrangement method of the first ohmic contact layer 71 are determined based on requirements, as long as it is provided between a semiconductor layer and a metal material.

Figure 3:
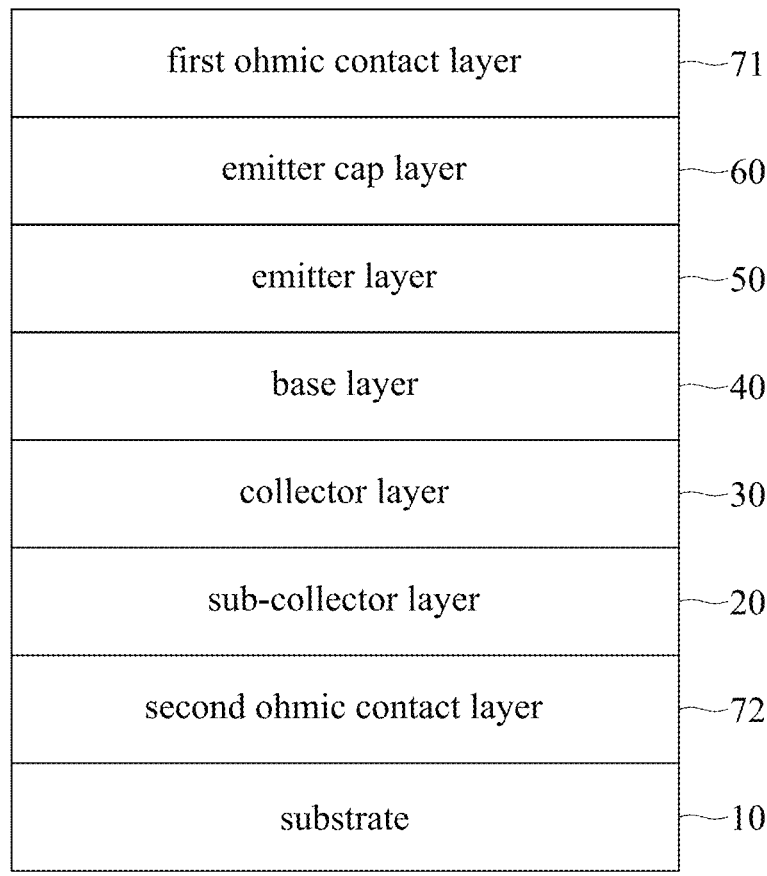
FIG. 3 is a schematic diagram showing a HBT according to a second embodiment of the present disclosure.

FIG. 3 is a schematic diagram showing a HBT according to a second embodiment of the present disclosure. As shown in FIG. 3, compared with the first embodiment of the present disclosure, the second embodiment further includes a second ohmic contact layer 72. The second ohmic contact layer 72 is disposed between the substrate 10 and the sub-collector layer 20. Alternatively, the second ohmic contact layer 72 is disposed on the base layer or an appropriate epitaxial layer.

The following content takes a laser diode as an example. The laser diode may be selectively provided with a buffer layer according to actual needs. In addition, in some embodiments, the materials of the buffer layer and the substrate may be the same. Besides, whether the buffer layer is provided or not is not substantially related to the technical features and effects to be provided in the following embodiments. Accordingly, for the sake of brief illustration, the following embodiments only use a laser diode with a buffer layer as an example for illustration, and do not repeat the description of a laser diode without a buffer layer. That is, the following embodiments, such as replacing a laser diode without a buffer layer, can also be applied integrally.

Figure 4:
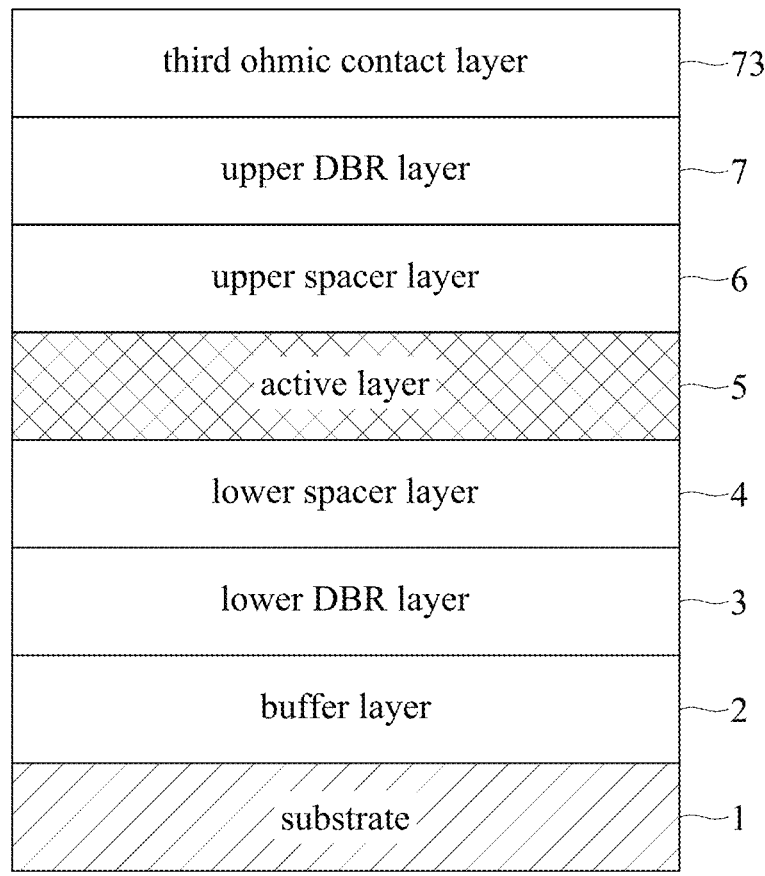
FIG. 4 is a schematic diagram showing a vertical cavity surface emitting layer diode (VCSEL) according to a third embodiment of the present disclosure.

FIG. 4 is a schematic diagram showing a vertical cavity surface emitting layer diode (VCSEL) according to a third embodiment of the present disclosure. FIG. 4 shows the structure of a VCSEL. The VCSEL shown in FIG. 4 includes a substrate 1, a buffer layer 2, a lower distributed Bragg reflector (DBR) layer 3, a lower spacer layer 4, an active layer 5, an upper spacer layer 6, an upper DBR layer 7 and a third ohmic contact layer 73.

In some embodiments, another third ohmic contact layer 73 is further disposed in the VCSEL, another third ohmic contact layer 73 may be disposed in the buffer layer 2 of the VCSEL shown in FIG. 4. In other words, part of or all of the buffer layer 2 is another third ohmic contact layer 73. Alternatively, the VCSEL of FIG. 4 may include a plurality of third ohmic contact layers 73 such that one of the third ohmic contact layers 73 may be formed in or on the buffer layer 2, and another of the third ohmic contact layers 73 may be formed on the upper DBR layer 7.

In one embodiment, a portion of the lower DBR layer 3, the lower spacer layer 4, the upper spacer layer 6 or the upper DBR layer 7 may include an ohmic contact layer with low nitrogen content.

Figure 5:
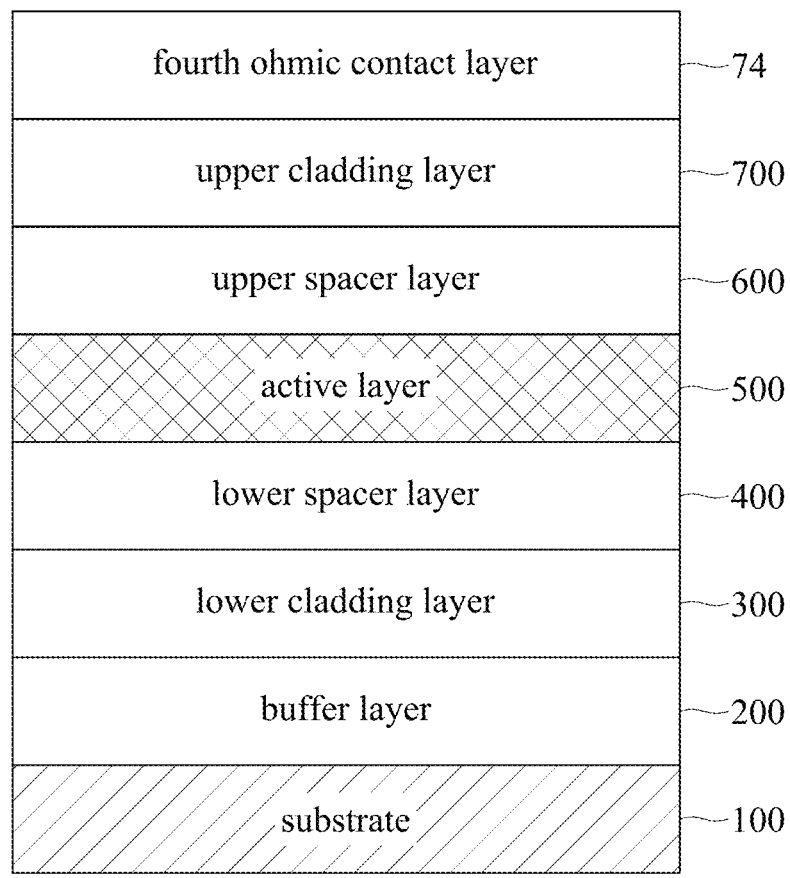
FIG. 5 is a schematic diagram showing an edge emitting laser (EEL) according to a fourth embodiment of the present disclosure.
Figure 6:
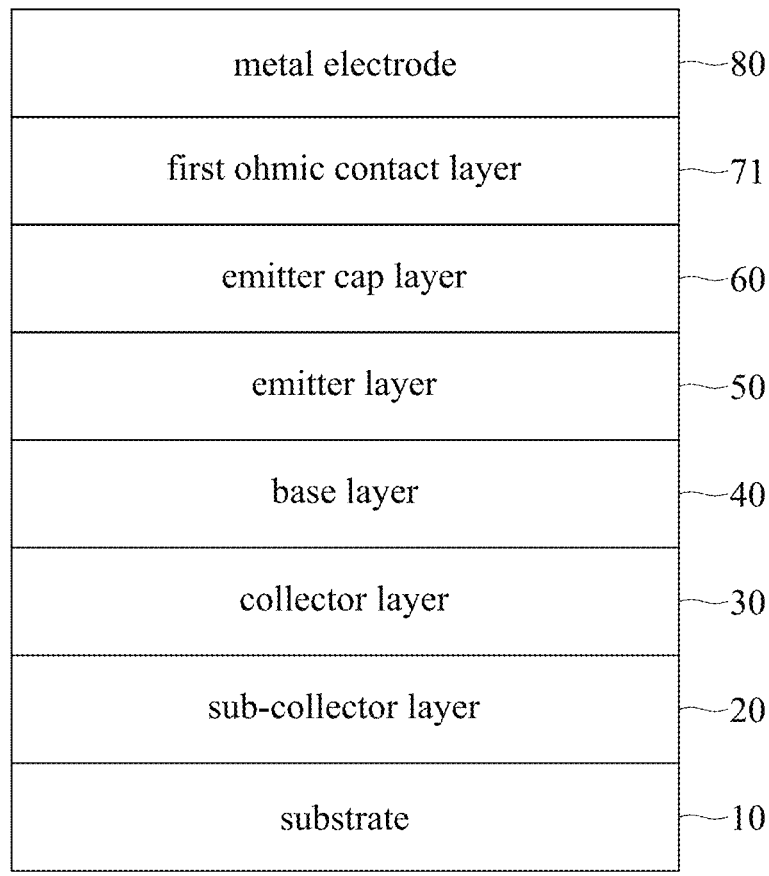
FIG. 6 is a schematic diagram showing a metal electrode according to one embodiment of the present disclosure.

FIG. 5 is a schematic diagram showing an edge emitting laser (EEL) according to a fourth embodiment of the present disclosure. FIG. 5 shows the structure of the EEL. The EEL shown in FIG. 5 includes a substrate 100, a buffer layer 200, a lower cladding layer 300, a lower spacer layer 400, an active layer 500, an upper spacer layer 600, an upper cladding layer 700 and a fourth ohmic contact layer 74.

In each of the above embodiments, the substrate 10 may be a Ge substrate, a GaAs substrate or an InP substrate according to the required properties of semiconductor devices. Properties generally refer to include electrical or optical properties.

GaAsN, GaAsNSb, GaAsNBi, GaAsNSbBi, InGaAsN, InGaAsNSb, InGaAsNBi or InGaAsNSbBi may be used for any one of the first to fourth ohmic contact layers 71 to 74. In order to simplify the description, ohmic contact layers are used to represent the first ohmic contact layer 71, the second ohmic contact layer 72, the third ohmic contact layer 73 or the fourth ohmic contact layer 74.

The Ge substrate may be used in combination with the materials of the ohmic contact layer, such as GaAsN, GaAsNSb, GaAsNBi, GaAsNSbBi, InGaAsN, InGaAsNSb, InGaAsNBi or InGaAsNSbBi. The GaAs substrate may be used in combination with the materials of the ohmic contact layer, such as GaAsN, GaAsNSb, GaAsNBi, GaAsNSbBi, InGaAsN, InGaAsNSb, InGaAsNBi or InGaAsNSbBi. Alternatively, the InP substrate may be used in combination with the materials of the ohmic contact layer, such as GaAsN, GaAsNSb, GaAsNBi, GaAsNSbBi, InGaAsN, InGaAsNSb, InGaAsNBi or InGaAsNSbBi.

The lattice mismatch between "ohmic contact layer and Ge," "ohmic contact layer and GaAs" or "ohmic contact layer and InP" is approximately 0~10000 ppm. The lattice mismatch refers to the differences between the lattice constant of the substrate and the lattice constant of the ohmic contact layer. In other words, the substrate has a first lattice constant $X_1$, and the ohmic contact layer has a second lattice constant $X_2$ such that the lattice mismatch is $X_1-X_2$. Specifically, the lattice mismatch may be ±300, ±1000, ±1500, ±2000, ±2500, ±3000, ±4000 or ±5000 ppm. The sign "+" stands for compressive stress, and the sign "—" stands for tensile stress.

With respect to $In_xGa_{1-x}As_yNi_{1-y}$, $In_xGa_{1-x}As_yN_zSb_{1-y-z}$, $In_xGa_{1-x}As_yN_zBi_{1-y-z}$ or $In_xGa_{1-x}As_yN_zSb_wBi_{1-y-z-w}$, x is 0~1. For example, x may be 0, 0.05, 0.10, 0.15, 0.20, 0.25, 0.30, 0.35, 0.50, 0.55, 0.60, 0.65, 0.70 or 0.75. Preferably, when the substrate is a GaAs substrate or a Ge substrate, x is about 0.05~0.3; and when the substrate is an InP substrate, x is about 0.5~0.75. In addition, y, z or w is 0.001~0.2. For example, y, z or w may be 0.005, 0.010, 0.015, 0.020, 0.021, 0.03, 0.04 or 0.05.

The ohmic contact layer has a thickness that is approximately 5~1000 nm. For example, the thickness of the ohmic contact layer may be 50, 100, 200, 400, 500, 700 or 900 nm.

Figure 7:
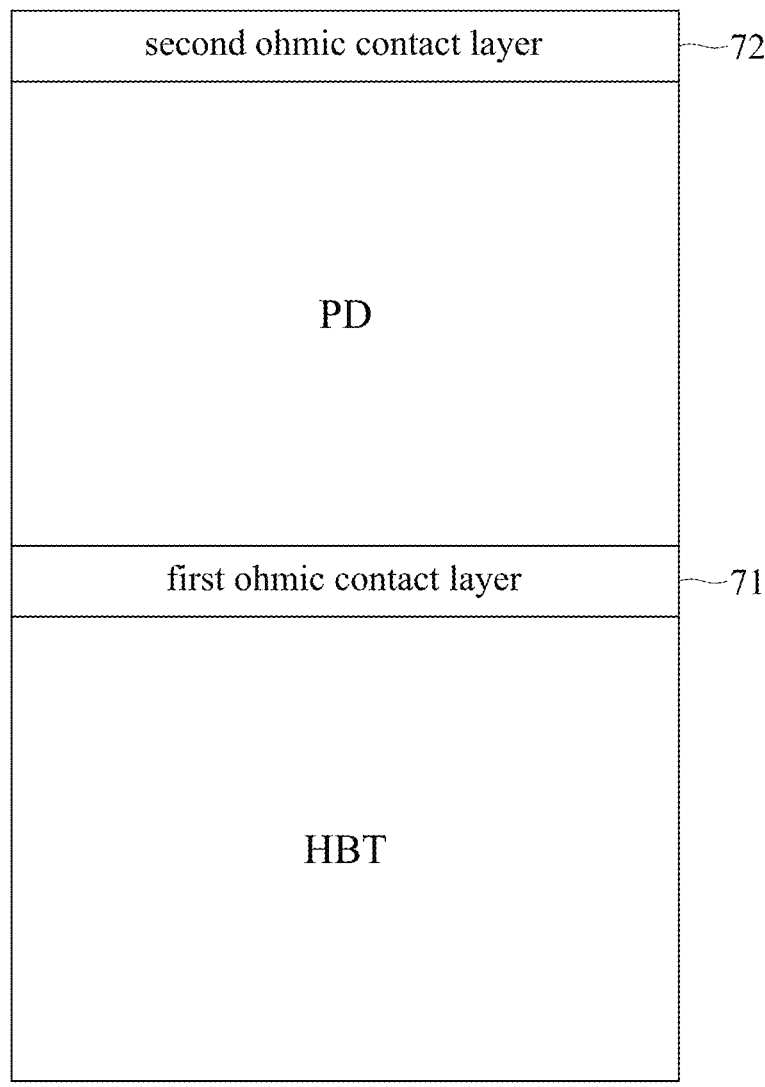
FIG. 7 is a schematic diagram showing a gallium arsenide (GaAs) integrated circuit according to one embodiment of the present disclosure.
Figure 8:
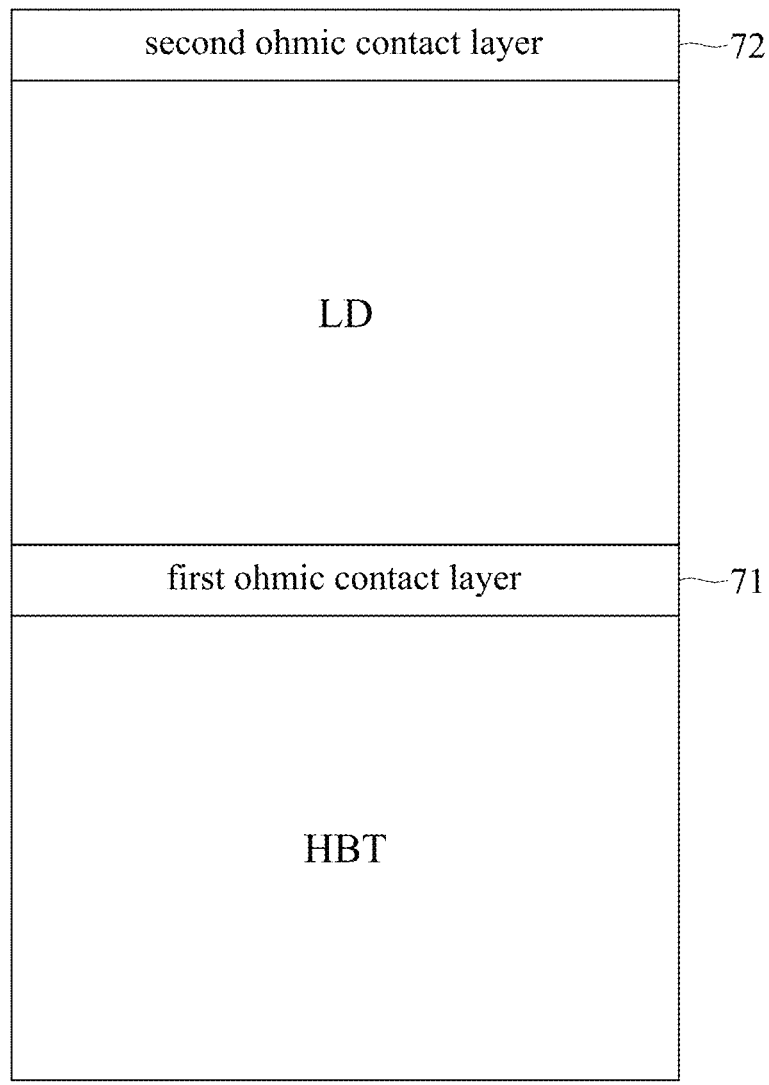
FIG. 8 is a schematic diagram showing a GaAs integrated circuit according to another embodiment of the present disclosure.

In the following, the (In)GaAsN ohmic contact layer is used as a representative to illustrate. Since the lattice constant of the (In)GaAsN ohmic contact layer is close to that of Ge, GaAs or AlGaAs, the ohmic contact layer will not have obvious stress during the crystallization process. As a result, a multi-layer epitaxial layer with good epitaxial quality can be formed on the ohmic contact layer. In other words, another device can be formed on the (In)GaAsN ohmic contact layer. Accordingly, an integrated circuit is provided. For example, two different gallium arsenide (GaAs) integrated circuits are shown in FIGS. 7 and 8, respectively. That is, each of the integrated circuits includes at least two semiconductor devices as shown in FIGS. 7 and 8.

In the prior art, an (In)GaAs ohmic contact layer or an (In)GaAsSb ohmic contact layer is used. Compared with the prior art, since the ohmic contact layer of the present disclosure is made of low nitrogen-containing materials such as (In)GaAsN, a carrier barrier between the "N-type ohmic contact layer" and the "N-type ohmic contact metal" will be reduced (as compared to the prior art InGaAs ohmic contact layer). Therefore, the ohmic contact characteristics of the "N-type ohmic contact layer" and the "n-type ohmic contact metal" may be better.

Similarly, compared with the prior art, the ohmic contact layer may be an (In)GaAsNSb, (In)GaAsNBi or (In)GaAsNSbBi ohmic contact layer. Since the ohmic contact layer of the present disclosure contains Sb or Bi, a carrier barrier between the "P-type ohmic contact layer" and the "P-type ohmic contact metal" will be reduced (as compared to the prior art InGaAs ohmic contact layer). Consequently, the ohmic contact characteristics of the "P-type ohmic contact layer" and the "P-type ohmic contact metal" may be better.

When the ohmic contact layer of the present disclosure is an InGaAsN, InGaAsNSb, InGaAsNBi or InGaAsNSbBi ohmic contact layer, the ohmic contact layer has a bandgap that is lower than that of the prior art such that the In content in InGaAsN, InGaAsNSb, InGaAsNBi or InGaAsNSbBi can be reduced. Hence, the generated reactants become less during each dry etching process. It is apparent that the period of cleaning and maintenance can be extended or the frequency of cleaning and maintenance can be reduced, thereby increasing production capacity or reducing costs. In particular, when the ohmic contact layer of the present disclosure is a GaAsN, GaAsNSb, GaAsNBi or GaAsNSbBi ohmic contact layer, since the ohmic contact layer does not contain In, fewer reactants are generated during each dry etching process, thereby prolonging the cycle of cleaning and maintenance or reducing the frequency of cleaning and maintenance. As a result, it is more conductive to increase production capacity or reduce costs.

In some embodiments, the ohmic contact layer may be further doped with a dopant material, and the dopant material includes Te, Se, Si, Sn, Ge, S, C, Zn or Cd. Generally, C, Zn and Cd can be doped into the ohmic contact layer alone, but the aforesaid two and three dopant materials can also be doped into the ohmic contact layer. Additionally, Te, Se, Si, Sn, Ge or S can also be doped into the ohmic contact layer. Alternatively, any two or more of the aforesaid dopant materials can also be doped into the ohmic contact layer.

In each of the above embodiments, the ohmic contact layer includes N-type III-V semiconductors or P-type III-V semiconductors.

The various embodiments described above can be used in cooperation with each other according to the required characteristics of a semiconductor device.

In addition to the ohmic contact layer that can be applied to HBT, VCSEL and EEL, it can also be applied to semiconductor devices that require ohmic contacts, such as FET, HEMT, PHEMT, BJT, BiFET, BiHEMT, PD, APD, LD, LED, SC. For example, the GaAs integrated circuit of FIG. 7 includes a HBT and a PD; and the GaAs integrated circuit of FIG. 8 includes a HBT and a LD.

In some embodiments, the "ohmic contact layer" using (In)GaAsN, (In)GaAsNSb, (In)GaAsNBi, or (In)GaAsNSbBi can form an ohmic contact with most metallic materials used for the ohmic contact. Referring to FIG. 8, a metal electrode 80 is further formed on the first ohmic contact layer 71, and the metal electrode 80 can be made of a P-type metal material or an N-type metal material.

In some embodiments, when the metal electrode 80 is made of a P-type metal material, the P-type metal material contains at least one of the metals Al, Ti, Au, Pt, Be, Zn, W. Alternatively, the P-type metal material has at least one compound, and the compound has at least one of the above metals. For example, the P-type metal material is a layered structure or alloy of Ti/Au, Ti/Pt/Au, AuBe and AuZn.

In some embodiments, when the metal electrode 80 is made of an N-type metal material, the N-type metal material contains at least one of the metals Al, Ti, Au, Pt, Ge, Ni, W. Alternatively, the N-type metal material has at least one compound, and the compound has at least one of the above metals. For example, the N-type metal material is a layered structure or alloy of Ti/Au, Ti/Pt/Au, Au/Ge/Ni, Au/Ge, Al/Ge and Al/Ge/Ni.

Figure 9A:
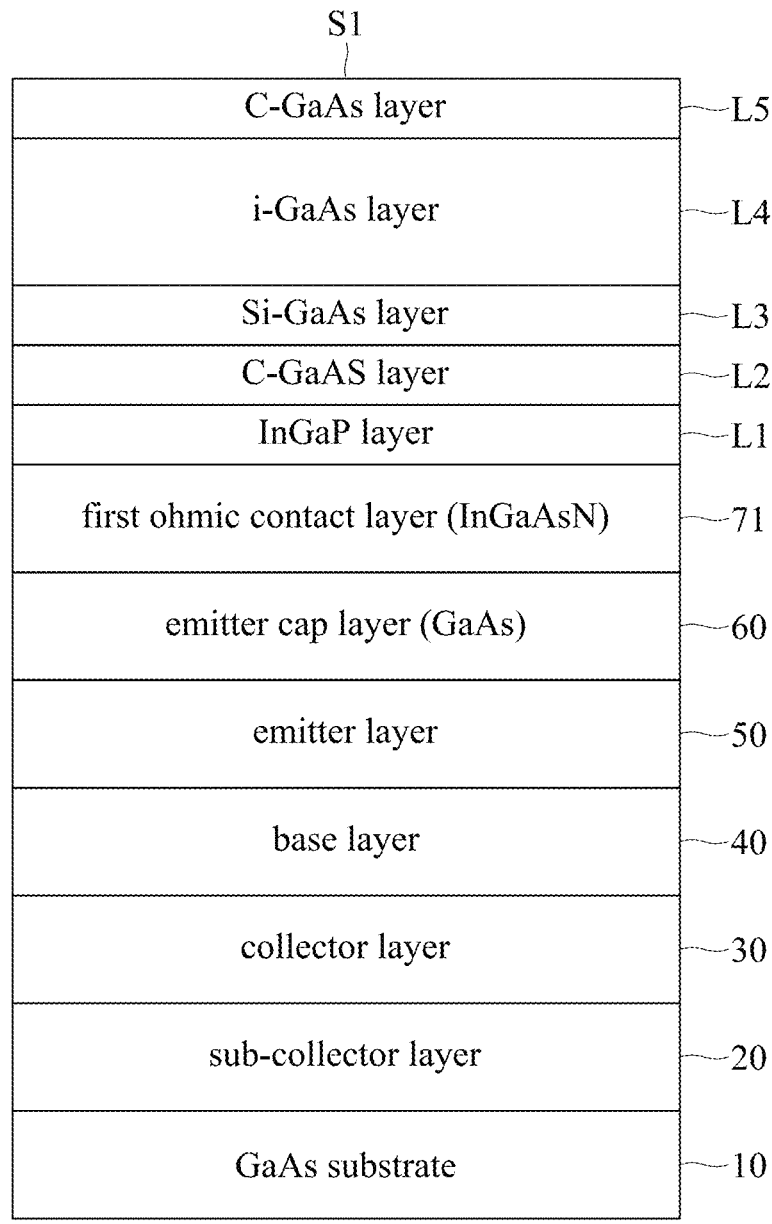
FIG. 9a is a schematic diagram of an epitaxially grown photodiode on top of the first ohmic contact layer (InGaAsN) of FIG. 1.
Figure 9B:
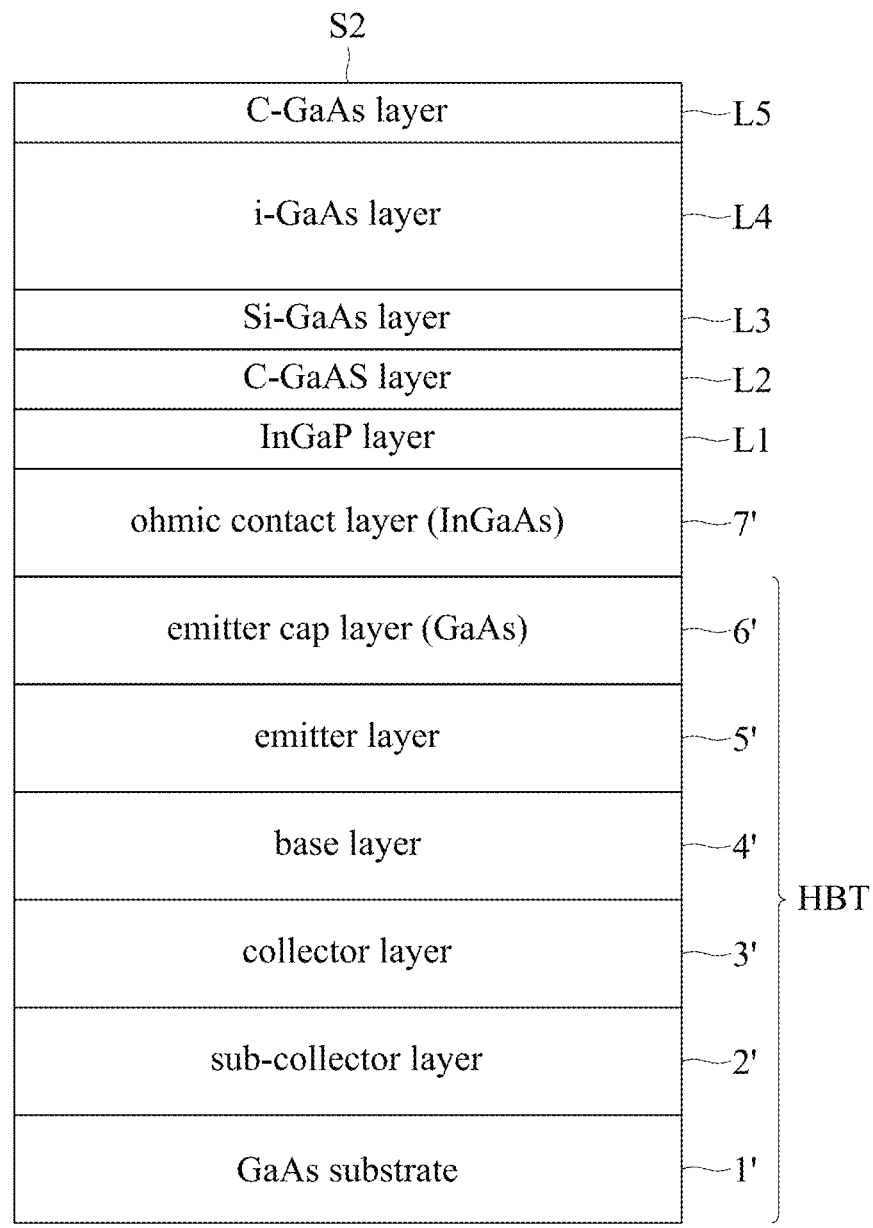
FIG. 9b is a schematic diagram of an epitaxially grown photodiode on top of the ohmic contact layer (InGaAs) of FIG. 1.

FIG. 9*a* is a schematic diagram showing multiple epitaxial layers formed on top of the first ohmic contact layer (InGaAsN) of FIG. 2, and FIG. 9*b* is a schematic diagram showing multiple epitaxial layers formed on top of the ohmic contact layer (InGaAs) of FIG. 1. FIGS. 9*a* and 9*b* are both epitaxial growth of the GaAs material system HBT on a GaAs substrate. The difference between FIG. 9*a* and FIG. 9*b* lies in the compound material of the ohmic contact layer.

The first ohmic contact layer of FIG. 9a is $In_xGa_{1-x}As_{1-y}N_y$ doped with tellurium (Te), the doping concentration of Te is about $2 \times 10^{19}$ cm$^{-3}$, and the total thickness of the first ohmic contact layer is about 1000 angstroms (Å). In addition, the first ohmic contact layer of FIG. 9a includes a compositionally graded layer with a thickness of about 500 Å and a compositionally uniform layer with a thickness of about 500 Å. The compositionally graded layer is closer to the GaAs substrate than the compositionally uniform layer. The contents of indium (In) and nitrogen (N) in the compositionally graded layer are higher as it is farther away from the substrate. The In content and the N content gradually increase to about 10% and 3.5%, respectively such that the compositionally uniform layer is about $In_{0.1}Ga_{0.9}As_{0.965}N_{0.035}$.

The ohmic contact layer of FIG. 9b is $In_xGa_{1-x}As$ doped with tellurium (Te), the doping concentration of Te is about $2 \times 10^{19}$ cm$^{-3}$, and the total thickness of the ohmic ohmic contact layer is approximately 1000 Å. Moreover, the ohmic contact layer in FIG. 9b also includes compositionally graded layer with a thickness of about 500 Å and a compositionally uniform layer with a thickness of about 500 Å. The compositionally graded layer is closer to the GaAs substrate than the compositionally uniform layer. The content of indium (In) in the compositionally graded layer is higher as it is farther away from the substrate. The In content gradually rises to 60% such that the compositionally uniform layer is about $In_{0.6}Ga_{0.4}As$.

The emitter cap layers in FIGS. 9a and 9b are GaAs doped with silicon (Si). Additionally, the same multiple epitaxial layers are also grown on the ohmic contact layer. As shown in FIGS. 9a and 9b, an InGaP layer L1 with a thickness of 200 Å, a carbon-doped GaAs layer L2 with a thickness of 900 Å, a silicon-doped GaAs layer L3 with a thickness of 5000 Å, an intrinsically doped GaAs layer L4 with a thickness of 12000 Å and a carbon-doped GaAs layer L5 with a thickness of 800 Å are sequentially formed on the first ohmic contact layer 71 or the ohmic contact layer 7'.

Figure 10B:
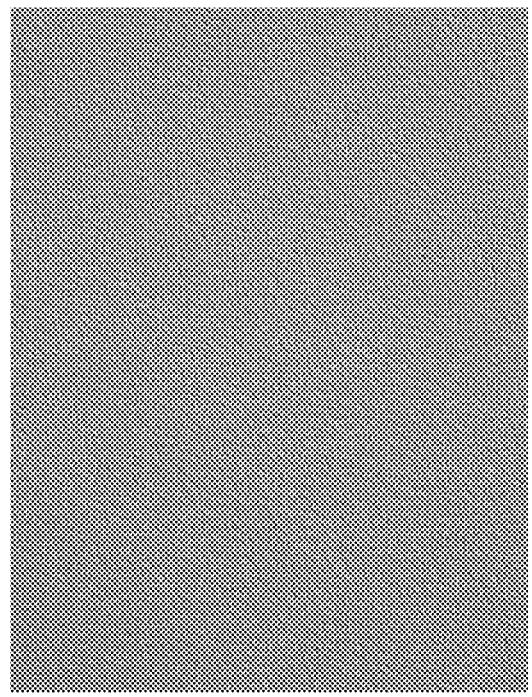
FIGS. 10a and 10b are images of the surface morphology of the top of the epiwafer in FIGS. 9a and 9b captured by an optical microscope.
Figure 10A:
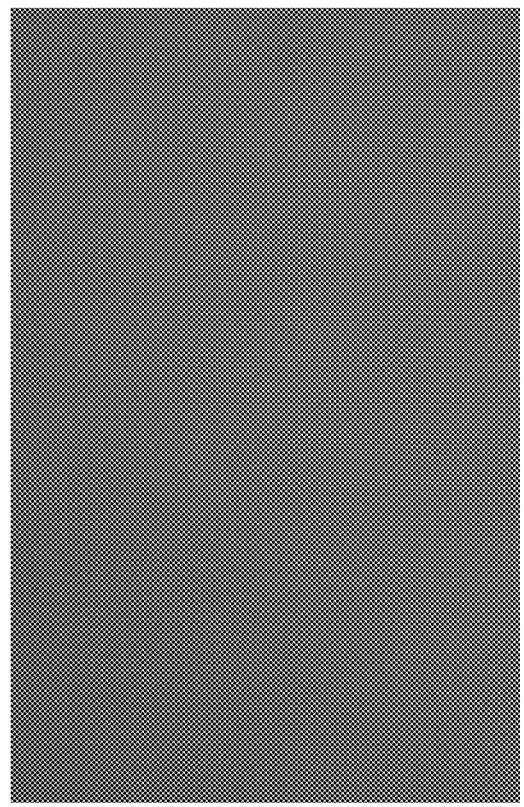

FIGS. 10a and 10b are images of the surface morphology of the top of the epiwafer in FIGS. 9a and 9b captured by an optical microscope. As shown in FIG. 10a, the top surface S1 of the epiwafer shown in FIG. 9a has a relatively flat surface morphology. It can be seen from FIG. 10a that the first ohmic contact layer and the multiple epitaxial layers have few defects, and the multiple epitaxial layers have good epitaxial quality. In contrast, according to FIG. 10b, the surface morphology of the top surface S2 of the epiwafer in FIG. 9b is rough, and it can be seen from FIG. 10b that the ohmic contact layer and the multiple epitaxial layers have serious dislocation and defects.

Figure 11:
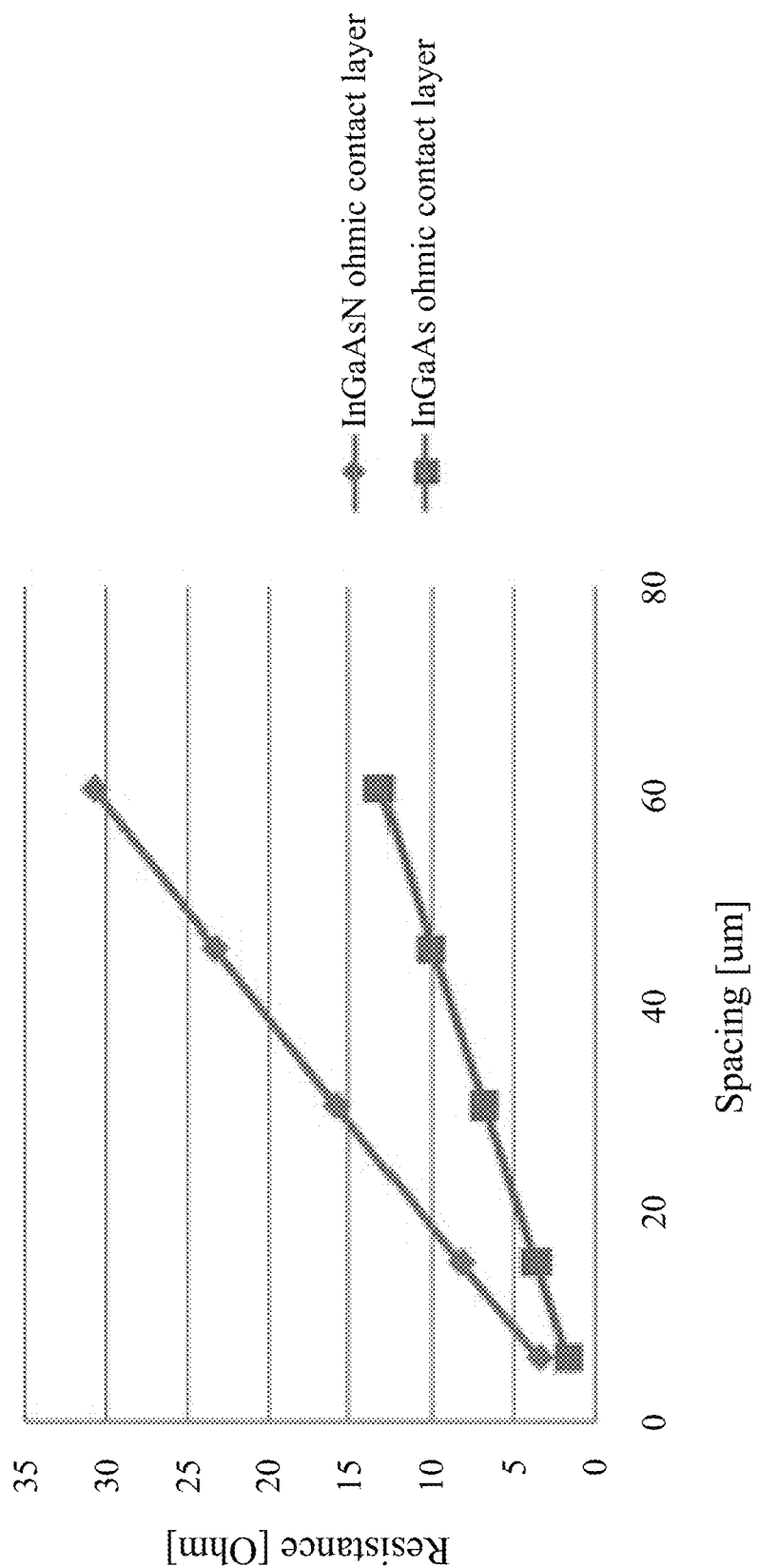
FIG. 11 is a schematic diagram showing the measurement results of the TLM resistance.

Further, the transmission line method (TLM) are used to evaluate the contact resistances of the first ohmic contact layer of FIG. 9a and the ohmic contact layer of FIG. 9b. For the measurement results, please refer to the schematic diagram of the measurement results of the TLM resistance in FIG. 11. The contact resistance of FIG. 9a is $3.37 \times 10^{-7}$ $\Omega$-cm$^2$, and the contact resistance of FIG. 9b is $3.24 \times 10^{-7}$ $\Omega$-cm$^2$. It can be seen that the ohmic contact layer containing nitrogen does not increase the contact resistance too much.

The foregoing has outlined features of several embodiments such that those skilled in the art may better understand aspects of the present disclosure. Those skilled in the art should understand that those skilled in the art can easily use the present disclosure as a basis for design or modifying other processes and structures. These other processes and structures serve to carry out the same purposes and/or achieve the same advantages of the embodiments introduced herein. Those skilled in the art should also understand that these equivalent structures do not depart from the spirit and scope of the present disclosure, and those skilled in the art can make various modifications, substitutions or alterations without departing from the spirit and scope of the present disclosure.

What is claimed is:

1. A semiconductor epitaxial wafer, comprising:
    a substrate having a first lattice constant X1, wherein the substrate is a Ge substrate, a GaAs substrate or an InP substrate;
    a first epitaxial stack structure epitaxially grown on the substrate;
    a first ohmic contact layer epitaxially grown on the first epitaxial stack structure and having a second lattice constant X2, wherein the first ohmic contact layer includes a material selected from the group consisting of $In_xGa_{1-x}As_yN_{1-y}$, $In_xGa_{1-x}As_yN_zSb_{1-y-z}$, $In_xGa_{1-x}As_yN_zBi_{1-y-z}$ and $In_xGa_{1-x}As_yN_zSb_wBi_{1-y-z-w}$, wherein x is 0~1 and y is 0.001~0.2, z is 0.001~0.2 and w is 0.001~0.2; and
    a second epitaxial stack structure epitaxially grown on the first ohmic contact layer,
    wherein a difference between the first lattice constant X1 and the second lattice constant X2 is less than or equal to ±10000 ppm.

2. The semiconductor epitaxial wafer as claimed in claim 1, wherein the first epitaxial stack structure and the second epitaxial stack structure are a first semiconductor device and a second semiconductor device, respectively.

3. The semiconductor epitaxial wafer as claimed in claim 1, wherein when the substrate is the Ge substrate or the GaAs substrate, and a GaAs-based material is used for the first epitaxial stack structure and the second epitaxial stack structure.

4. The semiconductor epitaxial wafer as claimed in claim 1, wherein when the substrate is the InP substrate, and an InP-based material is used for the first epitaxial stack structure and the second epitaxial stack structure.

5. The semiconductor epitaxial wafer as claimed in claim 1, wherein the first epitaxial stack structure further comprises a semiconductor layer, the semiconductor layer is in contact with or adjacent to the first ohmic contact layer, and when the substrate is the GaAs substrate, the semiconductor layer is formed by a material selected from the group consisting of GaAs, AlGaAs, InAlAs, InGaP and InGaAs.

6. The semiconductor epitaxial wafer as claimed in claim 5, further comprising a bandgap graded layer disposed between the semiconductor layer and the first ohmic contact layer.

7. The semiconductor epitaxial wafer as claimed in claim 1, wherein the first epitaxial stack structure further comprises a semiconductor layer, the semiconductor layer is in contact with or adjacent to the first ohmic contact layer, and when the substrate is the InP substrate, the semiconductor layer is formed by a material selected from the group consisting of InAlAs, InGaP, InP, InAlGaAs and InGaAsP.

8. The semiconductor epitaxial wafer as claimed in claim 7, further comprising a bandgap graded layer disposed between the semiconductor layer and the first ohmic contact layer.

9. The semiconductor epitaxial wafer as claimed in claim 1, further comprising a second ohmic contact layer disposed between the substrate and the first epitaxial stack structure.

10. The semiconductor epitaxial wafer as claimed in claim 1, wherein the first ohmic contact layer is doped with a dopant material, and the dopant material includes at least one material selected from the group consisting of Te, Se, Si, Sn, Ge, S, C, Zn and Cd.

11. The semiconductor epitaxial wafer as claimed in claim 1, wherein a metal electrode is further formed, the metal electrode is a P-type metal material or an N-type metal material, the P-type metal material is a material selected from the group consisting of Al, Ti, Au, Pt, Be, Zn and W, and the N-type metal material is a material selected from the group consisting of Al, Ti, Au, Pt, Ge, Ni and W.

* * * * *